United States Patent [19]
Wang et al.

[11] Patent Number: 5,398,712
[45] Date of Patent: Mar. 21, 1995

[54] PURGEABLE CONNECTION FOR GAS CYLINDERS

[75] Inventors: Hwa-Chi Wang, Downers Grove; Richard J. Udischas, Chicago; Benjamin Jurcik, Willowbrook, all of Ill.

[73] Assignee: American Air Liquide, Walnut Creek, Calif.

[21] Appl. No.: 72,304

[22] Filed: May 27, 1993

[51] Int. Cl.$^6$ .............................. B01F 5/04; B08B 5/02
[52] U.S. Cl. ................... 137/15; 134/166 C; 137/240; 137/888; 222/148
[58] Field of Search ............ 137/1, 15, 240, 888, 137/889, 3; 134/166 C, 167 C, 168 C, 169 C; 222/148

[56] References Cited

U.S. PATENT DOCUMENTS

| | | | |
|---|---|---|---|
| 2,540,064 | 1/1951 | Weber | 137/888 |
| 3,412,749 | 11/1968 | McAdams et al. | 137/240 |
| 3,552,568 | 1/1971 | Wade | 137/888 |
| 4,169,486 | 10/1979 | Otteman et al. | 137/240 |
| 4,248,692 | 2/1981 | Knebel et al. | 137/240 |
| 4,333,833 | 6/1982 | Longley et al. | 137/888 |
| 4,383,547 | 5/1983 | Lorenz et al. | 137/240 |
| 4,416,610 | 11/1983 | Gallagher, Jr. | 137/888 |
| 4,483,805 | 11/1984 | Glindsjo | 137/889 |
| 4,722,363 | 2/1988 | Allyn | 137/888 |
| 4,869,301 | 9/1989 | Ohmi et al. | 137/240 |
| 4,913,192 | 4/1990 | Vavra | 137/889 |
| 4,917,136 | 4/1990 | Ohmi et al. | 137/15 |
| 5,137,047 | 8/1992 | George | 137/240 |

*Primary Examiner*—George L. Walton
*Attorney, Agent, or Firm*—Malcolm B. Wittenberg

[57] ABSTRACT

A device and a method for its use for the removal of contaminants from a gas cylinder valve assembly. The valve assembly output is fed to the device which in turn has inlet and outlet connections to receive and to pass purge gas therethrough. The device is sized and positioned so that contaminants can be purged and a vacuum drawn from the gas cylinder valve assembly at the assembly location itself thus increasing the efficiency of contaminant removal.

13 Claims, 6 Drawing Sheets

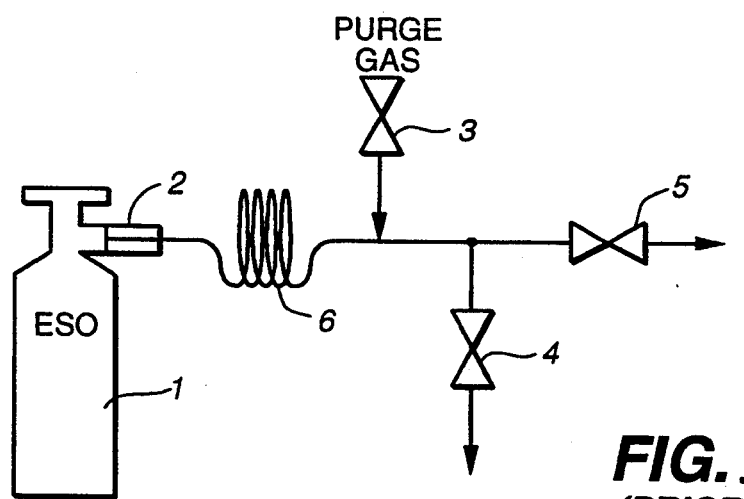
FIG._1A
*(PRIOR ART)*
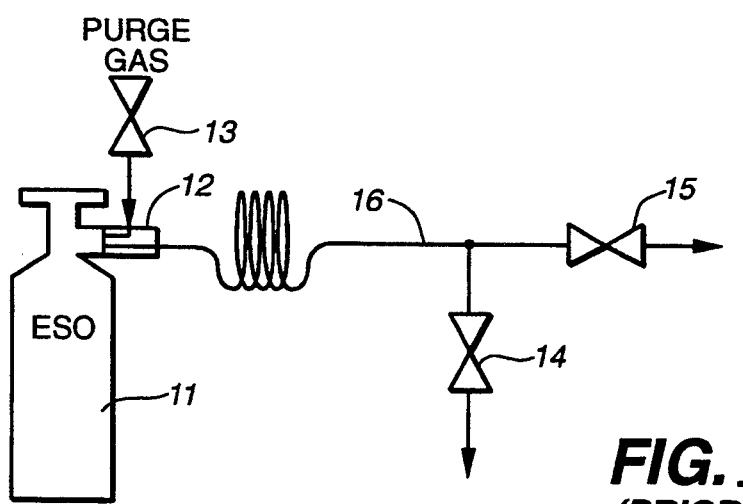
FIG._1B
*(PRIOR ART)*
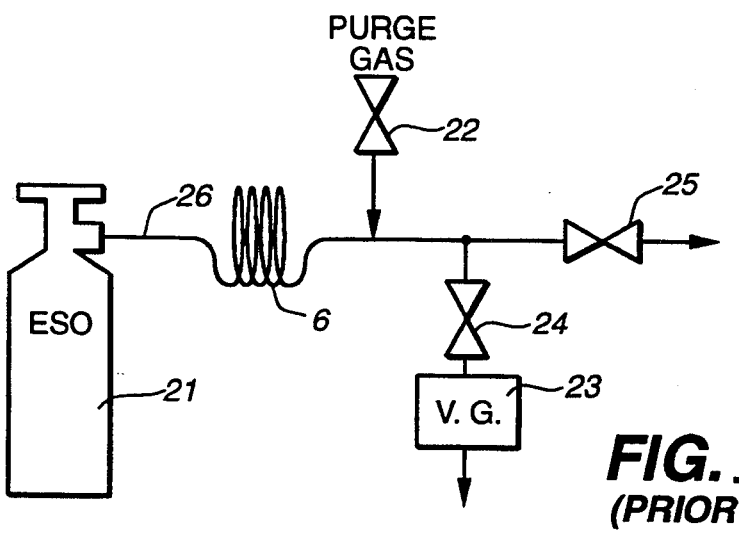
FIG._1C
*(PRIOR ART)*

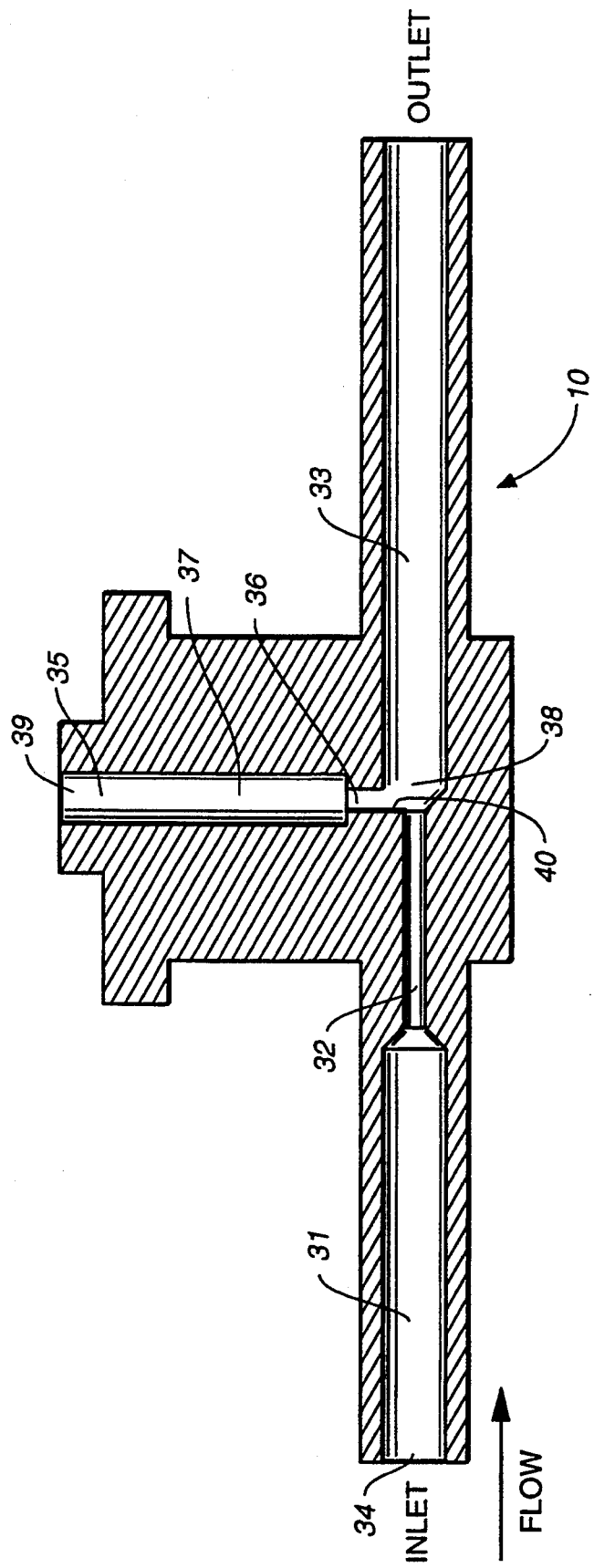
FIG._2

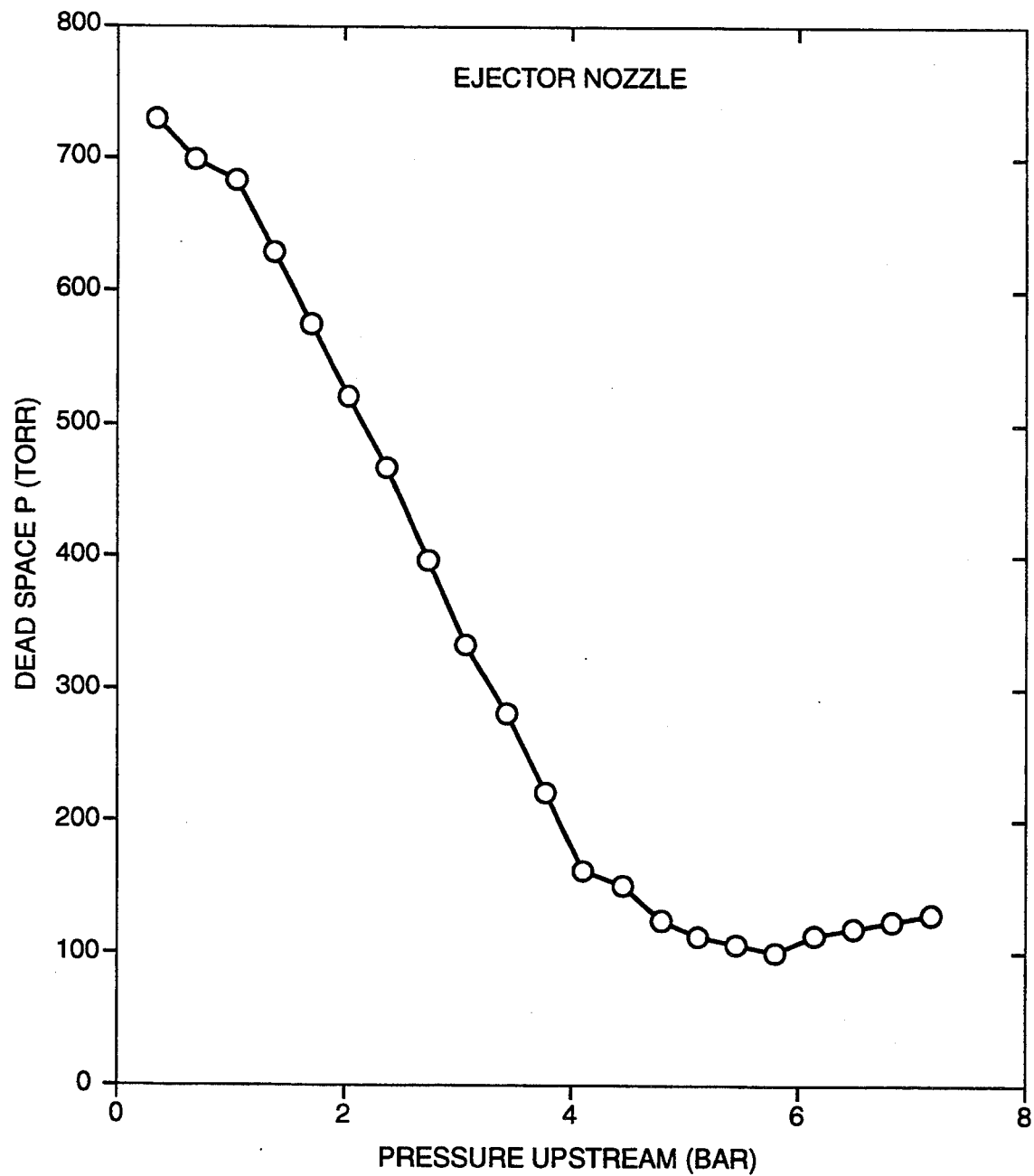
FIG._3

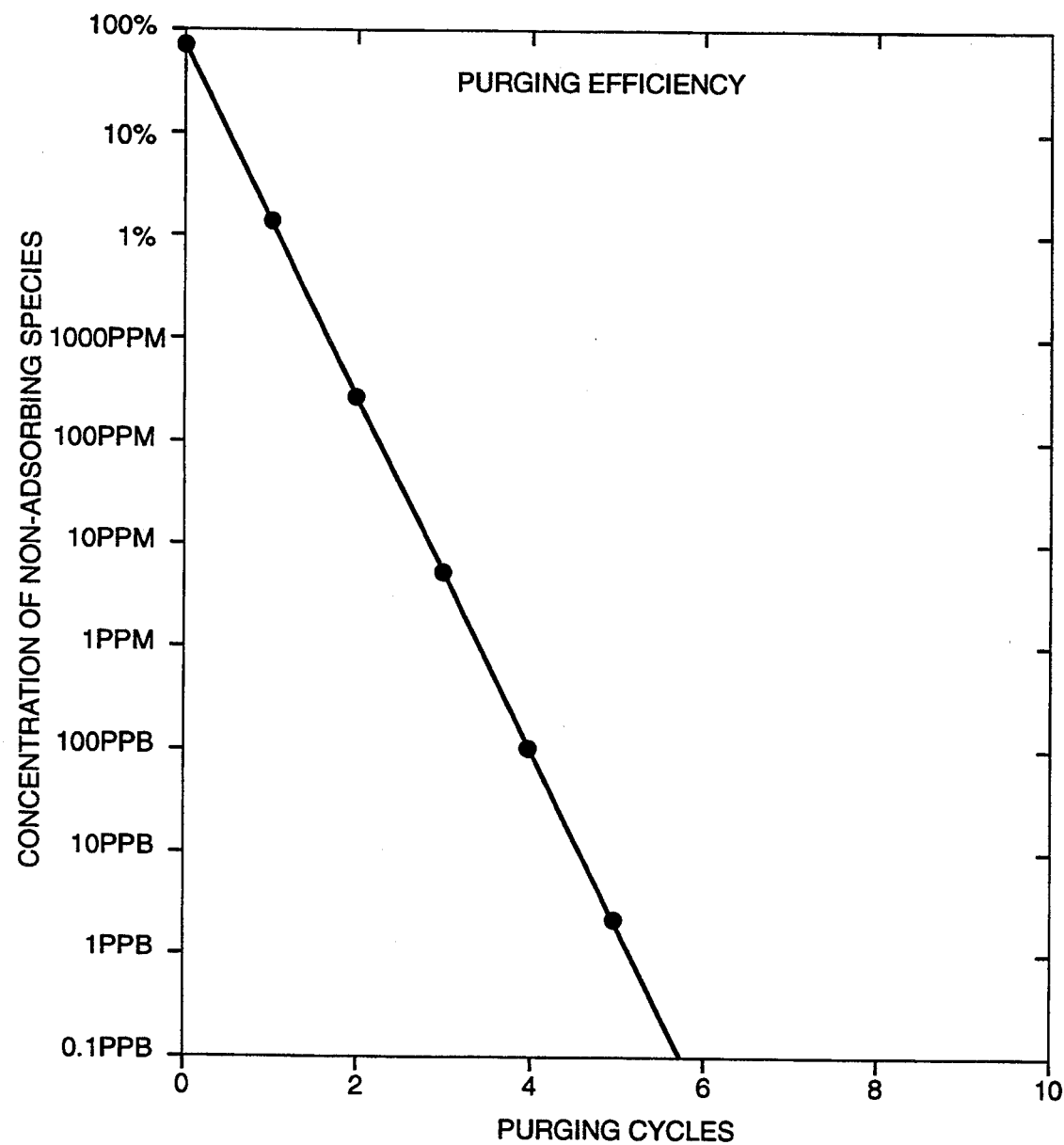
FIG._4

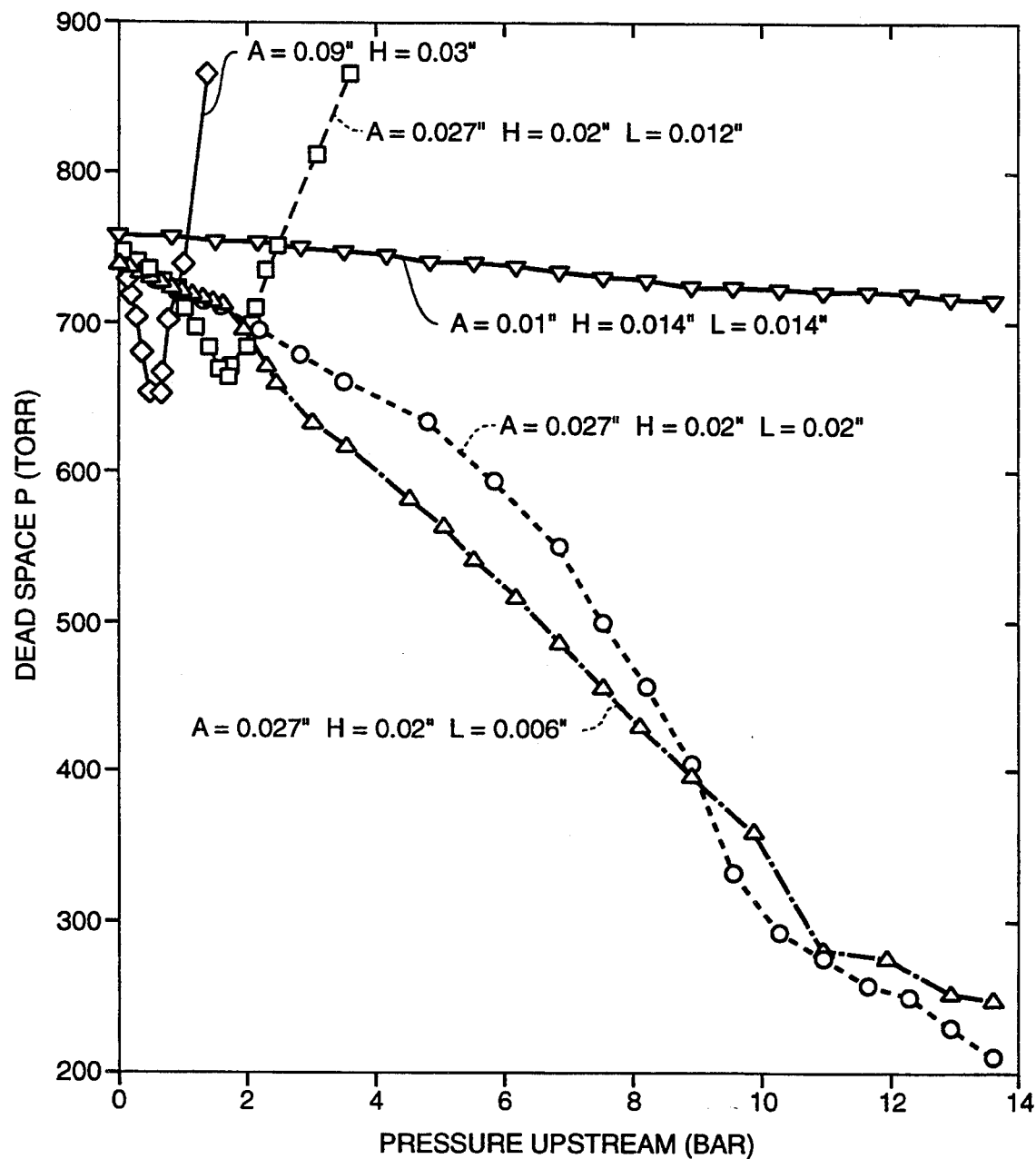
FIG._5

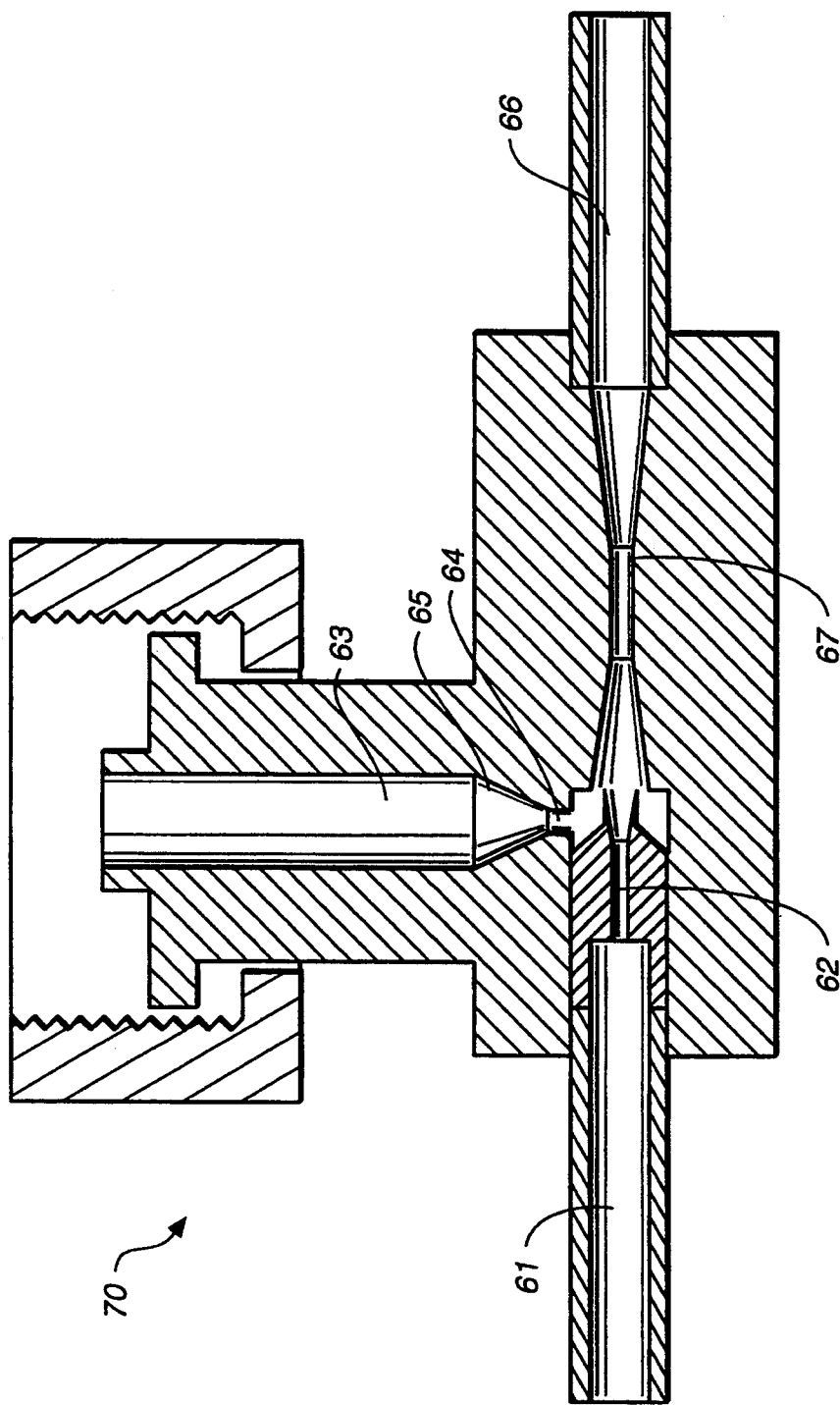
FIG._6

PURGEABLE CONNECTION FOR GAS CYLINDERS

TECHNICAL FIELD OF THE INVENTION

The present invention involves a device and method for its use in the removal of contaminants from a gas cylinder valve assembly. Both vacuum and purge techniques are employed at high efficiency.

BACKGROUND OF THE INVENTION

It has become increasingly important in a number of various and diverse industries to have access to ultra high purity process gas supply systems. For example, in the semi-conductor industry, as integrated circuits or similar components become smaller in size, in the micron or submicron ranges, thin film etching processes require gases of ultra high purity. Without a reliable reaction environment for film making and etching, repeatable results are not always achievable.

Although there is ample supply of UHP gases, it is common to experience the introduction of ambient contaminants during cylinder change-out. As noted, these contaminants and their reaction products with process gases can significantly degrade the performance of any UHP gas system.

The problems discussed above are certainly well known and appreciated. In fact, it is common practice to purge ambient contaminants after cylinder change-out and before opening the cylinder valve. In this regard, reference is made to FIG. 1 which depicts three known purging techniques, namely cross-purge, deep purge and vacuum purge.

FIG. 1(A) depicts a typical cross-purge configuration whereby UHP gas cylinder 1 containing high purity gas at high pressure is fed through control valve/cylinder connection 2. Typically, gas travels through a process line depicted by "pigtail" 6 for feeding a process gas through valve 5. Purging takes place by closing valve 2 and applying the purge gas through valve 3 which is exhausted through exhaust valve 4. Although this process provides for some contaminant removal, too much "dead volume" is left in "pigtail" 6 and cylinder connection 2 to adequately remove sufficient contamination.

FIG. 1(B) depicts what is known as a deep purge procedure whereby UHP gas cylinder 11 is functionally attached to connector 12 which further embodies valve 13 for the introduction of purge gas through line 16 and exhaust valve 14. Deep purge provides improved contaminant removal in light of purge gas introduction through valve 13 at connector 12. As such, deep purge eliminates the "dead volume" in the "pigtail" and particularly in the cylinder connection itself. By maintaining process valve 15 in a closed condition, purging is generally accomplished by several pressure cycles, that is, by opening and closing exhaust valve 14, line 16 can be pressurized and depressurized. In doing so, deep purge is effective in removing contaminants in the "dead volume" of the cylinder connection but is not effective in removing contaminants adsorbed on the surface of components. Another problem with the deep purge process is that it is not possible to protect the cylinder valve connection from ambient contaminants by flowing an inert gas through the connecting pieces during cylinder change out.

The present state of the art purge techniques are shown in FIG. 1(C). In this instance, UHP gas cylinder 21 feeds gas to line 26. However, purge gas introduced through valve 22 is employed in conjunction with vacuum generator 23. Purge gas is admitted to line 26 while both vacuum valve 24 and process valve 25 remain in a closed condition. After purge gas pressure buildup, valve 24 is opened and vacuum generator 23 employed to exhaust the purge gas from line 26.

Even the configuration depicted in FIG. 1(C) is not without its drawbacks. Specifically, it has been found that vacuum generator 23 is simply too far from cylinder 21 and its cylinder connection where contamination occurs. The effectiveness of vacuum purge degrades significantly with distance especially for adsorbing species such as moisture. In addition, a vacuum generator increases costs as well as the physical dimension of the purge unit contributing to the complication of system operation.

It is noted that most semi-conductor processing gases, such as those recited in U.S. Pat. No. 4,917,136 are introduced through flow restricting orifices installed in cylinder valve assemblies for safety purposes. Deep purge, cross purge and vacuum purge will not effectively remove contaminants from such flow restricting orifices.

It is thus an object of the present invention to provide a device for purging cylinder valve assemblies more effectively than those employed by the prior art as discussed above.

It is yet a further object of the present invention to provide a device for the removal of contaminants from a gas cylinder valve assembly having fewer parts and being less complex than devices used for the same purpose as discussed above.

These and further objects will be more readily appreciated when considering the following disclosure and appended claims wherein:

FIG. 1, previously discussed, depicts, in schematic, three prior art approaches to the problem of contaminant removal;

FIG. 2 depicts one embodiment of the present invention in cross-section;

FIG. 3 is a graphical depiction of the relationship between vacuum pressure created in the operation of the present invention as a function of purge gas pressure;

FIG. 4 is a graphical representation of the relationship between the calculated concentration of non-adsorbing species versus the number of purging cycles in practicing the present invention;

FIG. 5 is a further graphical representation of the relationship between dead space pressure measured as function of purge gas flow rate at different internal dimensions of the present invention; and FIG. 6 is yet another embodiment shown in cross-section of the device of the present invention.

SUMMARY OF THE INVENTION

The present invention involves a device and method for its use in the removal of contaminants from a gas cylinder valve assembly. Such assemblies are configured with an inlet for connection to a gas cylinder and an outlet for connection to fittings for receiving the contents of the gas cylinder.

The device itself comprises a purge gas inlet having a first orifice cross-section, a purge gas outlet having a second orifice cross-section and a third orifice connecting the first and second orifices. The third orifice is characterized as having a reduced cross-section in comparison to the first and second orifices.

A fourth orifice is provided joining the gas cylinder valve assembly outlet at its proximate end while joining the second orifice at its distal end. The distal end of the fourth orifice is located at a point where the second and third orifices meet noting that at that point, the fourth orifice is provided with a reduced cross-section.

DETAILED DESCRIPTION OF THE INVENTION

The invention can perhaps best be appreciated with reference to FIG. 2 whereby device 10 is shown in cross-section. Specifically, fourth orifice 35 shown in a generally vertical orientation is intended to be connected to a gas cylinder valve assembly (not shown). It is this assembly which is intended to be purged of contaminants. Generally, such purging is done at start-up or when breaking into a system for repair and maintenance and when changing cylinders. The purge gas is introduced within first orifice 31 in a direction shown by flow arrow 38. The purge gas can consist of any gaseous material inert and unreactive with the process being contemplated and process gases being employed. Generally, nitrogen is considered appropriate for most applications.

Purge gas introduced at open end 34 passes through the device of the present invention and exits through second orifice 33. First orifice 31 and second orifice 33 are connected by a third orifice 32 which, as noted, is provided with a reduced cross-section. Fourth orifice 35, as noted, is connected to a gas cylinder valve assembly at its proximate end 39 and is joined to second orifice 33 at its distal end 40 which is characterized as having a reduced cross-section.

In operation, the cylinder valve (not shown) and exhaust valve located along second orifice 33 (not shown) are closed and the purge valve (not shown) is opened allowing purge gas to enter the present device. An exhaust valve located within second orifice 33 can be periodically opened and closed thus altering the pressure within the device at will. Purge gas flowing through the first, second and third orifices create a vacuum within the fourth orifice, the extent of the vacuum being a function of purge gas pressure. In this regard, reference is made to FIG. 3 for the relationship between pressure achieved within the fourth orifice measured as a function of purge gas pressure. It has been found that the purge gas pressure should be increased typically to approximately 8 bar or more in order to create a vacuum within orifice 35 of approximately 200 torr or greater. This pressure in turn is imposed upon the "dead volume" of the cylinder connection.

The repeated cycling of purge gas pressure increase and release significantly improves the efficiency of contaminant removal from the gas cylinder valve assembly. In this regard, reference is made to FIG. 4 where the concentration of non-adsorbing species within this assembly was calculated with respect to purging cycles at a purging pressure of 105 psia creating a vacuum pressure of 2 psia.

As noted previously, many gas cylinder valve assemblies, particularly those employed in the introduction of processing gas to semiconductor thin film manufacturing, are provided with flow restrictors which are virtually impossible to decontaminate. As a further advantage of practicing the present invention, such flow restrictor devices can be completely eliminated from such gas cylinder valve assemblies for the present device in employing its fourth orifice of reduced cross-section at its distal end acts as a suitable flow constrictor which obviously suffers from none of the contamination shortcomings of prior devices.

In that the vacuum is created within orifice 35 and in turn within a suitable gas cylinder valve assembly through venturi effects created by the relative location and geometry of the various orifices, it is not surprising that orifice size and orientation are critical in optimizing the present device. Specifically, it has been found that orifice 32 having a generally cylindrical configuration and circular cross-section should be provided with a radius of 0.027 inches ±0.003 inches. Similarly, orifice 36 located at the distal end of orifice 35 should also be of a substantially cylindrical configuration having a radius of 0.020 inches ±0.005 inches. As noted, location is also critical. Specifically, orifice 32 transitions into orifice 33 in a ramp fashion forming a frustum of a cone at 38. To optimize performance, orifice 36 is positioned such that its center line 37 is located 0.020 inches ±0.005 inches from the beginning of the conical transition from orifice 32 to orifice 33.

In confirming the criticality of the above-recited physical dimensions and spacial positioning between the various orifices, experimental data was generated as graphically presented in FIG. 5. Specifically, the source pressure of the purge gas was varied creating a venturi-induced vacuum within the "dead space" of a typical gas cylinder valve assembly. In interpreting FIG. 5, "A" is the radius of orifice 32 while "H" is the radius of orifice 36. L is the measured distance between center line 37 and the beginning of the transition between orifice 32 and orifice 33. Quite obviously when operating within the physical dimensions recited previously, the efficiency of the vacuum created within the "dead space" of a gas cylinder assembly increases dramatically as a function of purge gas flow rate.

The device shown in FIG. 2 can be modified while remaining within the spirit and scope of the present invention. Obviously, since there are a wide variety of cylinder valves available which have various dimensions for the fourth orifice the optimum dimensions will change. The general design can be used for the other cylinder valves, however, and optimum dimensions for the first, second and third orifices determined. For example, FIG. 6 depicts a typical modification which, in some instances, enhance the overall efficiency of the present invention. As noted, although first orifice 61 and third orifice 62 are similar to their corresponding components 31 and 33 of FIG. 2, second orifice 66 is provided with a throat of reduced dimension 67. This obviously would increase purge gas flow rate and thus the efficiency of venturi-created pressure within fourth orifice 63. It is further noted, where FIG. 2 shows an abrupt step within orifice 4 when progressing to its distal end of reduced cross-section 36, this transition between the body of fourth orifice 63 and its distal end of reduced cross-section 64 can be ramped as shown as element 65. As noted, other modifications can also be made while remaining within the spirit and scope of the present invention which is to be limited only by the appended claims.

We claim:

1. A device for the removal of contaminants from a gas cylinder valve assembly said assembly having an Inlet for connection to said gas cylinder and an outlet for connection to fittings for receiving the contents of said gas cylinder, said device comprising a purge gas inlet having a first orifice cross-section, a purge gas outlet having a second orifice cross-section and a third orifice connecting said first and second orifices said third orifice being of reduced cross-section, a fourth orifice joining said gas cylinder valve assembly outlet at its proximate end and joining said second orifice at its distal end, at a location where said second and third orifices meet, said fourth orifice being further characterized as having a reduced cross-section proximate its distal end and wherein said third orifice of reduced cross-section is configured to transition to said second orifice as a frustum of a cone-shaped ramp located where said second end third orifices meet and at said distal end of said fourth orifice to enhance a vacuum within said fourth orifice for removal of said contaminants from said gas cylinder valve assembly.

2. The device of claim 1 wherein an exhaust valve is positioned across said second orifice for controllably increasing and reducing purge gas pressure within said device and for controlling said vacuum within said fourth orifice.

3. The device of claim 1 wherein said fourth orifice further acts as a flow restrictor for cylinder gas exiting said cylinder valve assembly.

4. The device of claim 1 wherein said third orifice is of cylindrical configuration having a radius of 0.027 inches ±0.003 inches.

5. The device of claim 1 wherein said fourth orifice is of cylindrical configuration wherein its radius at its distal end of reduced cross-section is 0.020 inches ±0.005 inches.

6. The device of claim 6 wherein said third orifice of reduced cross-section is configured to transition to said second orifice of cylindrical configuration whereby a longitudinal center line of said fourth orifice is positioned from the beginning of said transition by 0.020 inches ±0.005 inches.

7. A method for the removal of contaminants from a gas cylinder valve assembly, said assembly having an inlet for connection to said gas cylinder and in outlet for connection to fittings for receiving the contents of said gas cylinder, said device comprising a purge gas inlet having a first orifice cross-section, a purge gas outlet having a second orifice cross-section and a third orifice connecting said first and second orifices said third orifice being of reduced cross-section, a fourth orifice joining said gas cylinder valve assembly outlet at its proximate end and joining said second orifice at its distal end at a location where said second and third orifices meet, slid fourth orifice being further characterized as having a reduced cross-section proximate its distal end, end wherein said third orifice of reduced cross-section is configured to transition to said second orifice as a frustum of a cone-shaped ramp located where said second and third orifices meet and at the distal end of said fourth orifice, said method comprising passing a quantity of purge gas through said first, second and third orifices creating a vacuum within said fourth orifice causing the drawing of contaminants from said gas cylinder valve assembly.

8. The method of claim 7 wherein the pressure of said purge gas within said device is controllably increased and reduced thus manipulating the vacuum created within said fourth orifice.

9. The method of claim 7 wherein the vacuum created within said fourth orifice is at least approximately −200 torr.

10. The method of claim 8 wherein the pressure of said purge gas is increased in said device to approximately at least 7 bar.

11. The method of claim 7 wherein said third orifice is of cylindrical configuration having a radius of 0.027 inches ±0.003 inches.

12. The method of claim 7 wherein said fourth orifice is of cylindrical configuration wherein its radius at its distal end of reduced cross-section is 0.020 inches ±0.005 inches.

13. The method of claim 12 wherein said third orifice of reduced cross-section is configured to transition to said second orifice of cylindrical configuration whereby a longitudinal center line of said fourth orifice is positioned from the beginning of said transition by 0.020 inches ±0.005 inches.

* * * * *